United States Patent [19]

Shimazu

[11] Patent Number: 5,290,717
[45] Date of Patent: Mar. 1, 1994

[54] METHOD OF MANUFACTURING SEMICONDUCTOR DEVICES HAVING A RESIST PATERN COINCIDENT WITH GATE ELECTRODE

[75] Inventor: Katsuhiro Shimazu, Chiba, Japan

[73] Assignee: Kawasaki Steel Corporation, Hyogo, Japan

[21] Appl. No.: 896,571

[22] Filed: Jun. 10, 1992

[51] Int. Cl.⁵ .......................................... H01L 21/265
[52] U.S. Cl. ........................................ 437/34; 437/57; 437/193; 437/913
[58] Field of Search .............. 437/34, 913, 193, 40, 437/30, 41

[56] References Cited

U.S. PATENT DOCUMENTS

| | | | |
|---|---|---|---|
| 4,517,731 | 5/1985 | Khan et al. | 437/34 |
| 4,590,663 | 5/1986 | Haken | 257/336 |
| 4,830,974 | 5/1989 | Chang et al. | 437/34 |
| 5,036,019 | 7/1991 | Yamane et al. | 437/57 |
| 5,091,763 | 2/1992 | Sanchez | 437/193 |

FOREIGN PATENT DOCUMENTS 59-238577 11/1984 Japan .
2-106043 4/1990 Japan .

OTHER PUBLICATIONS

J. Y. C. Sun et al., Study Of Boron Penetration through Thin Oxide With P+-Polysilicon Gate, Symposium on VLSI Technology, 1989, pp. 17-18.

*Primary Examiner*—Olik Chaudhuri
*Assistant Examiner*—H. Jey Tsai
*Attorney, Agent, or Firm*—Oliff & Berridge

[57] ABSTRACT

A method of manufacturing a semiconductor device including a MOS transistor, wherein a second resist pattern having openings respectively defining gate, source, and drain regions is formed while leaving a first resist pattern on a gate material film, i.e., a polycrystalline silicon film, which is used to form a gate electrode. Impurities are implanted into the source and drain regions by using the first and second resist patterns as a mask. The impurities are stopped in the inside of the first resist pattern on the gate and are not implanted into the gate.

2 Claims, 2 Drawing Sheets

METHOD OF MANUFACTURING SEMICONDUCTOR DEVICES HAVING A RESIST PATERN COINCIDENT WITH GATE ELECTRODE

BACKGROUND OF THE INVENTION

1. Field of the Invention

The present invention relates to a method of manufacturing semiconductor devices having a source region, a gate region, and a drain region, and in particular, to a method of manufacturing semiconductor devices in which impurities are implanted to the source and the drain region by using as a mask a gate pattern of a transistor (FET: Field Effect Transistor) having a metal-oxide semiconductor structure.

2. Description of the Prior Art

Semiconductor devices having a so-called MOS (Metal-Oxide Semiconductor) structure which employs a capacitor structure constituted by a metal-oxide semiconductor are widely known in the art. The semiconductor devices having the MOS structure are manufactured by a process in which various technical improvements such as self alignment, thin film formation, application of polycrystalline silicon, micro lithography, field isolation (LOCOS), ion implantation, etc., are included. By virtue of the technical improvement as mentioned above, an improvement in performance, a reduction of pattern, an improvement in integration density, and the like have been achieved one by one. Furthermore, such a method is introduced in which the density of elements is increased by overlapping polycrystalline silicon layers into double layers, or triple layers in a three-dimensional fashion.

As a technique of forming a minute pattern in these applied technologies, there is a self alignment technique which does not use a mask. This technique offers advantages in which highly accurate pattern alignment can be achieved without retaining a margin for mask alignment, degradation of performance and decrease in yield due to a deviation in positioning are small, and the number of times of use of mask can be reduced. Accordingly, the improvement in accuracy and the simplification of the manufacturing process can be achieved, and thus, the self alignment technique is widely used recently in a semiconductor manufacturing process.

In an electrode self alignment process for forming an electrode by the use of the self alignment technique mentioned above, for example, in the case of forming a silicon gate electrode, as shown in FIG. 5, an element isolating oxide film 103 is formed on an N type silicon substrate 101, and after forming a channel region 105 for controlling a threshold voltage, by an ion implantation of impurities, a gate oxide film 107 is formed. Then, after forming a gate material film 109 on the gate oxide film 107, a first resist pattern on the gate material film 109 is removed by etching. Following this, a second resist pattern 111 having openings defining a gate region and a drain region is formed. Subsequently, by using the gate material film 109 and the second resist pattern 111 as a mask, impurities such as p (phosphorus), B (boron), As (arsenic), or the like are implanted into the source region 113 and the drain region 115. This impurity implantation technique is primarily performed in order to enable to carry out introduction of low concentration impurities, doping through an insulator, or the like which is impossible or very difficult by a method of thermal diffusion.

Owing to the recent progress in the miniaturization technique, for example, in CMOS VLSIs (Complementary MOS Very Large Scale Integrated Circuit) having a channel length of 0.5 micrometers or less, the thickness of a gate electrode and a gate oxide film is made thin in accordance with a miniaturization pattern. Due to the formation of such thinner films of the gate electrode and the gate oxide film, a serious problem arises which has not posed any problem in the prior art technique.

Specifically, in the above-mentioned electrode self alignment technique, impurities are implanted through the gate material film as a mask. As a result, if the gate material film is formed with a sufficiently thick mask material with respect to a range of ions implanted therein, the ions will stop in the inside of the gate material film and will not reach into a substrate underlying the mask. However, due to the recent thinner film formation of the gate material film, the possibility of reaching of the ions into the inside of the substrate is increasing. Furthermore, even if the gate material film is designed to have a large thickness as compared with the range of ions taking into account the energy of implanted ions, the kind of ions, the state of a substrate, etc., for example, if a subsequent heat treatment is performed for the purpose of annealing for activating impurities, and for the purpose of oxidation of a semiconductor substrate, the impurities which have been stopped inside the gate material film will be thermally diffused into a channel region penetrating through a gate oxide film. Here, the diffusion of the impurities into the channel through the gate oxide film is referred to as "penetration of impurities through the oxide film" as is usually called. Since this penetration through the oxide film alters a preset impurity concentration in the channel, for example, a threshold voltage and a current characteristic of a MOS transistor will be varied from desired values. This, in turn causes non-uniformity in the quality of products, and causes reduction of the reproducibility, the rate of good products, the yield, etc., of the products. This effect of thermal diffusion of impurities is reported by semiconductor researchers. (For example, refer to the article by J. Y. C. Sun et al. "Study of Boron Penetration through Thin Oxide with P+ Polycilicon Gate", 1989 symposium on VLSI technology, p.17, 1989)

As a method of interrupting the thermal diffusion, it is known in the art to form a gate insulation film consisting of SiN or SiON.

However, since the SiN film contains many electron traps, the amount of electric charges trapped in the SiN film is not stabilized after a semiconductor device is completed. Accordingly, there is a problem in that the transistor characteristics including a threshold voltage, conductance, and the like are not stabilized, and that the transistor characteristics are changed due to trapping of electrons in the SiN film resulting in degradation of the reliability of the products.

Although the SiON film can relieve the problem posed by the SiN film, it is not sufficient to ensure the reliability of the products. Furthermore, the SiON film is inferior to the SiN film in the capability of interrupting the thermal diffusion of impurities.

Moreover, in order to form the gate insulation film consisting of SiON, it is necessary to perform a nitriding treatment under a high temperature in an atmosphere of $NH_3$ or $N_2$ after an $SiO_2$ film is formed. Thus, a problem arises in that the number of processes is increased, and the productivity is lowered.

SUMMARY OF THE INVENTION

The present invention is intended to solve the above problems, and it is an object to provide a method of manufacturing a semiconductor device which method enables to miniaturize the structure of the semiconductor device without varying a threshold value and a current characteristic from desired values, and which enables to form an electrode by self alignment.

In order to achieve the object, in one aspect of the present invention, a method of manufacturing a semiconductor device having a source region, a gate region, and a drain region comprises the steps of, in forming the gate region, forming a gate material film on a gate oxide film, forming a first resist pattern coincident with a shape of a gate on the gate material film, and forming the gate region by etching the gate material film by using the first resist pattern as a mask, and in forming the source region and the drain region, forming a second resist pattern having openings defining the gate region, the source region, and the drain region while leaving the first resist pattern, and implanting impurities into portions corresponding to the source region and the drain region by using first resist pattern and the second resist pattern as a mask.

In another aspect of the present invention, the method of manufacturing a semiconductor device further comprises the step of, after forming the first resist pattern, irradiating the first resist pattern with ultraviolet rays to apply a hardening treatment on the first resist pattern.

In still another aspect of the present invention, the gate oxide film is formed to have a film thickness of not larger than 120 Å.

In still another aspect of the present invention, at least one of boron, phosphorus, and arsenic is implanted as the impurities.

In the present invention, the second resist pattern having openings defining the gate region the source region and the drain region is further formed while leaving the first resist pattern on the gate material film which is used to form the gate electrode, and desired impurities are implanted into the source region and the drain region by using the first resist pattern and the second resist pattern as the mask. As a result, it is possible to stop the impurities in the inside of the resist film on the gate material film. Accordingly, since the impurities are not implanted into the inside of the gate, the penetration of the impurities through the oxide film does not occur. Consequently, the desired threshold value and the current characteristic of MOS transistors can be obtained stably.

Furthermore, in the present invention, it is necessary to form the second resist pattern while retaining the shape of the first resist pattern. For this purpose, it is more effective to irradiate the first resist pattern with ultraviolet rays after forming the same thereby to harden the first resist pattern due to a cross-linking reaction of resist molecules. By virtue of this, the shape of the first resist pattern can be maintained stably against coating, exposure, and development processes of the second resist pattern.

Furthermore, in the present invention, since the impurities are not implanted into the gate, there are no limitations to the manufacturing conditions as mentioned below.

The penetration of impurities is more apt to be caused when the temperature in the subsequent heat treatment processes such as annealing and oxidation is high. For this reason, in the prior art, it was necessary to suppress the temperature in the subsequent heat treatment processes at low temperatures. However, in the present invention, the temperature range is not restricted.

Furthermore, in order to make smooth the stepped portions by causing reflow of a BPSG film used as the insulation film, it was effective to anneal in an atmosphere of water vapor. However, when the annealing is performed in the atmosphere of water vapor, the penetration of impurities is apt to be caused. For this reason, in the prior art, it was impossible to perform the subsequent heat treatment processes in the atmosphere of water vapor. In the present invention, the heat treatment process is possible in the atmosphere of water vapor and the atmosphere for the heat treatment process is not restricted.

Furthermore, the penetration of impurities is apt to be caused as the film thickness of the gate oxide film becomes thin. This phenomenon is apt to occur, although depending on the temperature in the subsequent heat treatment process when the film thickness of the gate oxide film becomes 120 or less. In the present invention, since the film thickness of the gate oxide film is not limited, it is effective, in particular, in manufacturing MOS transistors having the gate oxide film having a film thickness of not larger than 120 Å.

Moreover, the penetration of impurities is also dependent on the kind of impurities. Although this penetration occurs also when the impurities such as boron, phosphorus, and arsenic which are usually used in semiconductors are implanted in particular, it is apt to be caused when boron having a large diffusion coefficient is used. However, in the present invention, there is no limitation to the selection of the impurities.

DESCRIPTION OF THE PREFERRED EMBODIMENT

With reference to the drawings, a method of manufacturing a semiconductor device according to an embodiment of the present invention will be described.

Figure 1:
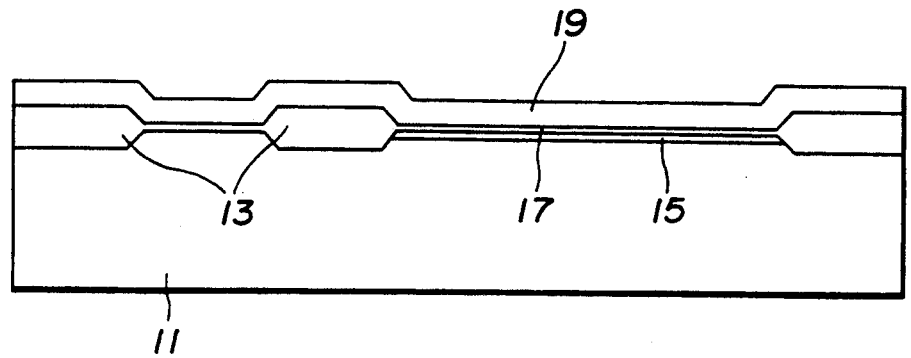
FIG. 1 is a partial sectional view illustrating a step in a manufacturing process of a semiconductor device in an embodiment of the present invention.
Figure 2:
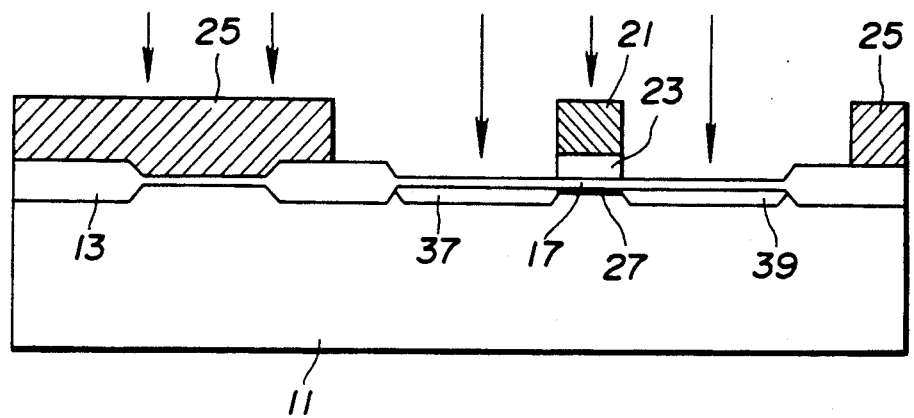
FIG. 2 is a partial sectional view illustrating a step in the manufacturing process of the semiconductor device in the embodiment of the present invention.
Figure 3:
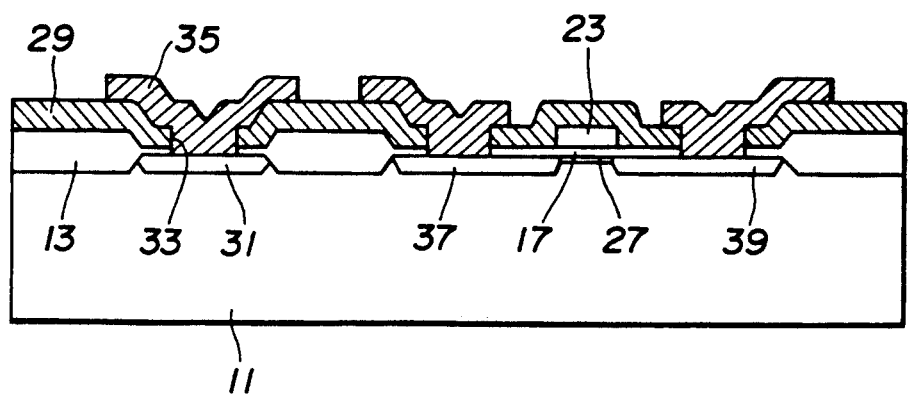
FIG. 3 is a partial sectional view illustrating a step in the manufacturing process of the semiconductor device in the embodiment of the present invention.

FIGS. 1 to 3 are partial sectional views illustrating steps in manufacturing a P channel MOS transistor as a semiconductor device in accordance with the present invention. These steps are one concrete example in manufacturing the P channel MOS transistor, and also the treatment conditions are merely exemplary purposes and are varied in various ways depending on desired characteristics of the MOS transistor or other factors.

In a process step shown in FIG. 1, an $SiO_2$ film is formed on an N type silicon substrate 11 by oxidation, and next, an $Si_3N_4$ film is formed on the $SiO_2$ film. Following this, after a mask pattern for selective oxidation is formed on the $Si_3N_4$ film, oxidation is further performed to form an isolation oxide film 13.

Subsequently, the impurity implantation for setting a threshold voltage for a channel region is carried out into the silicon substrate 11 having the isolation oxide film 13 formed thereon, and a channel impurity layer 15 is formed.

Next, the silicon substrate 11 having the channel impurity layer 15 formed thereon is oxidized in an oxygen atmosphere at 900° C. for 25 minutes to form a silicon dioxide film having a film thickness of about 100 Å. This silicon dioxide film constitutes a gate oxide film 17. In this manner, even when the thickness of the gate oxide film 17 is made thin, in the present invention, since the impurity implantation is performed by using a first and a second resist pattern 21 and 25 as a mask as will be described later, it is possible to interrupt the impurities from reaching the silicon substrate 11.

Subsequently, a polycrystalline silicon film 19 is formed as a gate material on the silicon dioxide film. This polycrystalline silicon film 19 is formed to have a film thickness of 3500 Å by a reduced pressure CVD (Chemical Vapor Deposition) technique using dicyclosilane as a reaction gas.

In order that the polycrystalline silicon film 19 provides N type conductivity, phosphorus (P) is doped. This doping is carried out by a bubbling technique using phosphorus oxychloride at 850° C. In this case, even when phosphorus (P) is doped into the polycrystalline silicon film 19 until phosphorus (P) is saturated, owing to a subsequent heat treatment process in this embodiment, the doped phosphorus (P) never penetrates through the gate oxide film 17 (having a film thickness of 100 Å) to diffuse into the channel region.

Next, in a process step shown in FIG. 2, after coating photoresist on the polycrystalline silicon film 19 obtained in the step in FIG. 1, the first resist pattern 21 for forming a gate is selectively formed by photolithography. Then, this first resist pattern 21 is irradiated with ultraviolet rays to harden the first resist pattern 21. By this hardening treatment, the shape of the first resist pattern 21 can be maintained more securely. Also, at the time of developing the second resist pattern 25, it is possible to prevent the first resist pattern 21 from being eroded by developing solution used in forming the second resist pattern 25. Accordingly, the second resist pattern 25 can be developed while maintaining the shape of the first resist pattern 21 stably.

Following this, the polycrystalline silicon film 19 is etched to form a gate 23 by using the first resist pattern 21 as a mask. In this case, the etching is performed by an anisotropical etching technique by using a mixed gas of sulfur hexafluoride and oxygen as a reaction gas.

Subsequently, the second resist pattern 25 having openings respectively defining a gate region, a source region, and a drain region is formed by photolithography while retaining the first resist pattern 21. In this case, the photoresist having viscosity of 30 cps is coated while rotating the semiconductor structure at a rotational speed of 3000 rpm thereby to form a photoresist film 1.6 micrometers in thickness, and then exposed and developed. In this embodiment, in forming both the first and second resist patterns, a photoresist "OFPR8600" (trade name) produced by Tokyo Ohka Co., Japan is used.

Next, impurites are implanted for P type source and drain regions by using the first resist pattern 21 and the second resist pattern 25 as a mask. By this implantation of the impurities, a source region 37 and a drain region 89 are formed. This impurity implantation is performed by an ion implantation technique, and as the ion, for example, $BF_2^+$ ion is implanted under the implantation conditions wherein implantation energy of 40 KeV, and a dose quantity of $3 \times 10^{15}$ atoms/$cm^2$. At this time, at least the first resist pattern 21 is formed on the gate 23, and this first resist pattern 21 serves as a mask for the impurity implantation. Furthermore, since the implantation energy is relatively low, the ion can be stopped sufficiently by the thickness of the first resist pattern 21. Accordingly, the $BF_2^+$ ion is not implanted into the gate 23. When this process step is performed by a prior art method, the $BF_2^+$ ion will be implanted into the gate 23, and thus, in the subsequent heat treatment process, boron ion will penetrate the gate oxide film 17 to diffuse into the channel region 27 resulting in alteration of the characteristics of the MOS transistor.

In a process step shown in FIG. 3, the first resist pattern 21 and the second resist pattern 28 obtained in the step in FIG. 2 are removed by a plasma ashing technique in an oxygen plasma.

In order to form an impurity implanted layer 31 for connecting the substrate, a third resist pattern 29 is formed by photolithography, and N type impurities are implanted by using the third resist pattern 29 as a mask. In this case, as the implantation technique, the ion implantation technique is used, and for example, $As^+$ ion is implanted under the implantation conditions wherein implantation energy of 50 KeV, and a dose quantity of $4 \times 10^{15}$ atoms/$cm^2$.

Subsequently, in order to activate the impurities, after performing a heat treatment in a nitrogen atmosphere at 900° C. for 30 minutes, interlayer insulation films including a silicon dioxide film, a phosphorus glass film, and the like are formed by the CVD technique. Then a contact hole 33 is formed, and a wiring 35 is formed by aluminum or the like to obtain a P channel MOS transistor.

As to the P channel MOS transistors manufactured in the above-described process steps according to the present invention, a drain current characteristic with respect of a gate voltage was tested. Furthermore, for the purpose of comparison, P channel MOS transistors were manufactured by a prior art manufacturing method and under the same conditions as described above, and a drain current characteristic with respect of a gate voltage was tested in the same way. The result of the tests is shown by a graph in FIG. 4.

Figure 4:
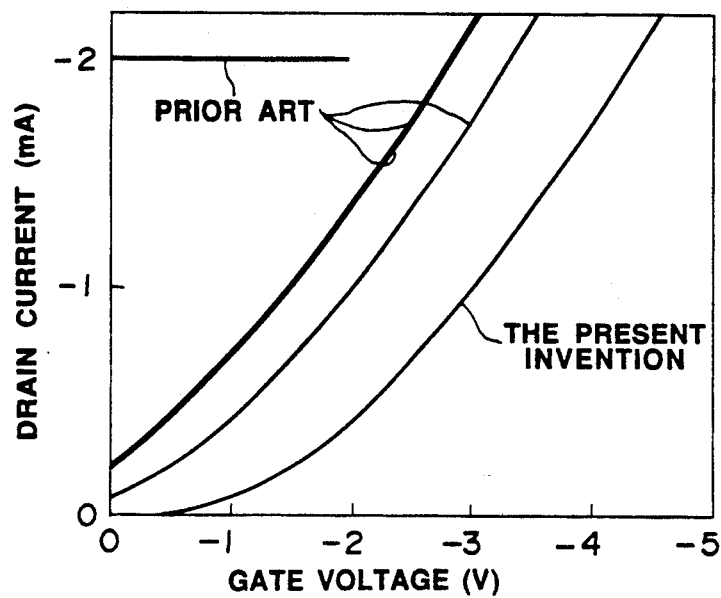
FIG. 4 is a graph showing current characteristics of a prior art semiconductor device and a semiconductor device manufactured by a manufacturing method of the present invention.
Figure 5:
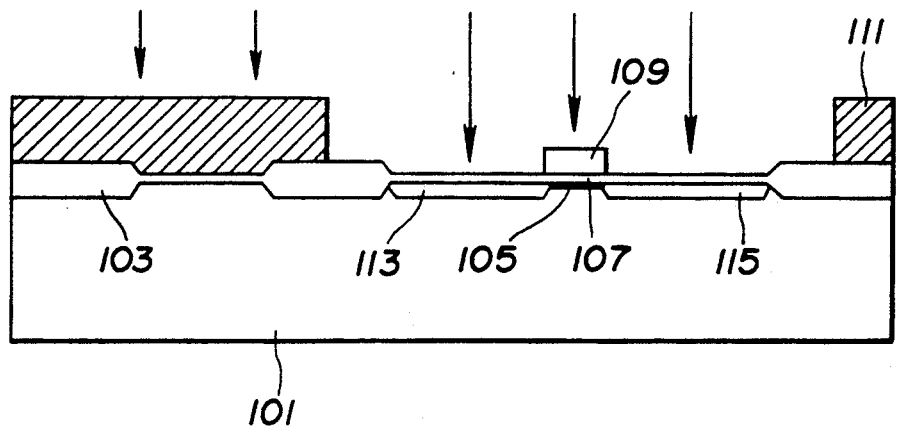
FIG. 5 is a partial sectional view of a semiconductor device obtained by an electrode self alignment process in the prior art manufacturing method.

With reference to FIG. 4, in the prior art MOS transistors, the drain current characteristics differ from one another depending on the tested individual transistors, and since the characteristics of drain current shift depending on individual transistors, the characteristic of a desired threshold voltage cannot be predicted. In one of the prior art MOS transistors, a drain current was constant with respect to a gate voltage. In contrast, in the MOS transistors in the present invention, the characteristic of the drain current was always constant.

In the embodiment described above, in the process step shown in FIG. 1, although the polycrystalline silicon film 19 is formed by the reduced pressure CVD technique, the present invention is not limited to this, and other forming techniques such as sputtering may be employed.

Furthermore, although the ion implantation is used as the impurity implantation technique, the present invention is not limited to this, and other technique wherein a resist pattern serves as a mask may be used. As the impurities, for example, elements such as B, P, As, Sb, etc., in the group 3 or group 5 can be used with respect to silicon.

Furthermore, the process step for forming the resist pattern in FIG. 2 includes resist processes such as resist coating, mask alignment, exposure, development, and the like in a lithography process. The first and second resist patterns 21 and 25 are formed by using a usual kind resist material, and the same material or different kinds of materials may be used. Also in this resist formation, a suitable resist process may be selected depending on the type of the semiconductor to be manufactured.

While a concrete example of implementing the method of manufacturing a semiconductor device is described as to the P channel MOS transistor, this manufacturing method is not limited to only the embodiment described above, and it can be applied to a variety of MOS transistors. For example, it is naturally applicable to N channel MOS transistors, and also applicable to various types of MOS LSIs. In particular, the manufacturing method of the present invention is suitable or effective in the case where the scale of the element becomes small due to miniaturization techniques, and it is effective in manufacturing CMOS VLSI having a channel length of 0.5 micrometers or less, and further, it is effective in manufacturing CMOS VLSI having a channel length of about 0.25 micrometers or less.

In the present invention the following advantages are provided.

In the present invention as described in the foregoing, the second resist pattern having openings defining the gate region, the source region and the drain region is further formed by leaving the first resist pattern on the gate material film which is used to form the gate electrode, and the impurities are implanted into the source region and the drain region by using the first resist pattern and the second resist pattern as the mask. As a result, it is possible to stop the impurities in the inside of the resist film on the gate material film. Accordingly, since the impurities never intrude into the inside of the gate material film, it is possible to increase a permissible range of the impurity ion implanting energy which is a factor for deciding a range of the implanted impurity. Furthermore, also a permissible range of the temperature in the heat treatment, and the like can be increased. As a result, the structure of the semiconductor device can be miniaturized without varying the threshold voltage and the current characteristic from desired values, and it is possible to provide the semiconductor device having a constant current characteristic.

What is claimed is:

1. A method of manufacturing a CMOS semiconductor device having a source region, a gate region, a drain region, and a substrate connecting region with a channel length of at most 0.5 $\mu$m, comprising the steps of:

forming a gate oxide film having a film thickness of at most 120 Å over a substrate;

forming a gate material film over the gate oxide film;

forming a first resist pattern coincident with a shape of a gate over the gate material film;

hardening the first resist pattern by irradiating with ultraviolet rays;

forming the gate region by etching the gate material film by using the first resist pattern as a mask;

forming a second resist pattern to cover the substrate connecting region, the second resist pattern having openings respectively defining the gate region, the source region, and the drain region prior to removal of the first resist pattern;

implanting impurities into portions of the substrate corresponding to the source region and the drain region by using the first resist pattern and the second resist pattern as a mask, the first resist pattern inhibiting the impurities from penetrating the gate region;

removing the first and the second resist patterns; and performing an annealing heat treatment to activate the impurities.

2. A method of manufacturing a semiconductor device according to claim 1, wherein in said step of implanting impurities, at least one of boron, phosphorus, and arsenic is implanted.

* * * * *